United States Patent [19]

Rojc

[11] Patent Number: 4,888,664
[45] Date of Patent: Dec. 19, 1989

[54] COOLING AIRFLOW COUPLING APPARATUS FOR AVIONIC TRAYS

[75] Inventor: Karl J. Rojc, Englewood, Colo.

[73] Assignee: Aspen Industries, Inc., Englewood, Colo.

[21] Appl. No.: 215,387

[22] Filed: Jul. 5, 1988

[51] Int. Cl.⁴ .............................................. H05K 7/20
[52] U.S. Cl. .................................... 361/383; 49/486;
174/153 G; 277/178
[58] Field of Search ............ 174/153 G, 152 G, 65 G;
248/27.1; 277/178, 226; 361/382, 383, 384;
49/485, 486, 489, 498; 165/80.3; 62/384, 385,
295, 438

[56] References Cited

U.S. PATENT DOCUMENTS

| | | | |
|---|---|---|---|
| 3,710,476 | 1/1973 | Hollingsead | 248/27.1 |
| 3,771,023 | 11/1973 | Hollingsead | 361/383 |
| 3,871,937 | 3/1975 | Hollingsead | 277/178 X |
| 4,252,245 | 2/1981 | Kudo | 277/178 |
| 4,687,127 | 8/1987 | Pardo | 49/498 |
| 4,766,517 | 8/1988 | Abell | 361/383 |

Primary Examiner—Gerald P. Tolin

[57] ABSTRACT

The apparatus disclosed provides both an airtight seal and a means for controlling and distributing the cooling airflow delivered to the electronic unit mounted on the avionic tray. A one piece, jointless gasket of uniform thickness is compressed between the tray, having an entirely flat bottom surface, and the detachable metering plate. The overlap created by a diffrential in the size of the airflow orifice for the tray and the airflow orifice for the gasket enables the gasket, when compressed by a plurality of flat head screws, to protrude above the equipment mounting surface on the tray. This protruding portion of the gasket engages the electronic unit when it is mounted on the tray effecting an airtight seal. The apparatus provides a highly reliable, readily interchangeable, and cost effective cooling airflow coupling for avionic trays.

6 Claims, 2 Drawing Sheets

COOLING AIRFLOW COUPLING APPARATUS FOR AVIONIC TRAYS

BACKGROUND-FIELD OF INVENTION

This invention relates to avionic racking, specifically to an improved cooling airflow coupling apparatus for avionic trays.

BACKGROUND-DESCRIPTION OF PRIOR ART

Electronic equipment mounted on board aircraft often utilize flow-through cooling air as a means of maintaining the operating temperatures necessary for proper performance and reliability. The cooling air, supplied by the aircraft, is distributed to each electronic unit via a series of ducts and plenum chambers. An orifice located on the bottom surface of the electronic unit enclosure permits the cooling air to be either drawn, or forced through the unit. The air is subsequently discharged out of vent openings.

Each electronic unit is supported by an individual tray. The electronic unit is installed by placing it upon the tray and moving it rearward until the electrical connector at the back of the electronic unit engages the electrical connector on the tray. These individual trays provide the coupling interface between the electronic units and the aircraft cooling system. A gasket, limiting the loss of cooling air, and an airflow metering plate, which controls and distributes the airflow, are the primary elements of this coupling interface.

Heretofore gaskets for avionic trays utilized an elongated, extruded construction. The gasket was cut to length, and bonded together at the ends to form an oval shape. The gasket, along with the metering plate, was then bonded, or pressed into a deeply recessed area located on the bottom of the tray.

These trays have problems and shortcomings in the areas of reliability, interchangeability, and cost. The joint created by bonding the extruded gasket together at the butt ends has shortcomings. Often, after repeated insertions and extractions of the electronic unit, the ends of the gasket will pull apart at this joint. The loss of airflow through the resultant gap compromises the cooling system and the electronic unit reliability.

The metering plate is difficult to interchange. Although press-fit gasket and metering pate assemblies were intended to be readily interchangeable, in practice, the close manufacturing tolerances required to make this system operable are difficult to consistantly achieve. In many cases, therefore, the gasket and metering plate become extremely difficult to install. The problem is further compounded by the loss of cooling air and the electrical connector misalignment which can occur if an avionic tray with an improperly seated gasket and metering plate is installed on board an aircraft.

Forming the deeply recessed area required on the bottom of the tray is expensive. Costly, specialized tooling is necessary to manufacture the tray. This is due to the fact that the depth of the recessed area required by prior cooling airflow coupling constructions was approximately equal to eight times the tray material thickness. Heat treating, adds yet another expense. The depth of the recessed area necessitates using material that is initially in a soft condition and subsequently hardened by heat treating to bring the material to the strength levels required in service.

OBJECTS AND ADVANTAGES

Accordingly several objects and advantages of my invention are: to provide a readily interchangeable gasket for avionic trays constructed from one piece of material, and free of all joints, seams, and other such means of attachment, whereby the elimination of such joints and seams will provide an impenetrable seal between the tray and the electronic unit, greatly enhancing the reliability of the electronic unit and the cooling system, to provide an easily detachable, and interchangeable metering plate which will align and seat with both the gasket and the tray, to provide such a metering plate that when constructed using standard manufacturing techniques will provide these positive alignment and seating features on a consistant basis, to provide a tray to be utilized with such a gasket and metering plate having an entirely flat bottom surface, eliminating the need for a recessed area, and thereby significantly lowering costs. Further objects and advantages of my invention will become apparent from a consideration of the drawing and ensuring description of it.

DRAWING FIGURES

Figure 1:
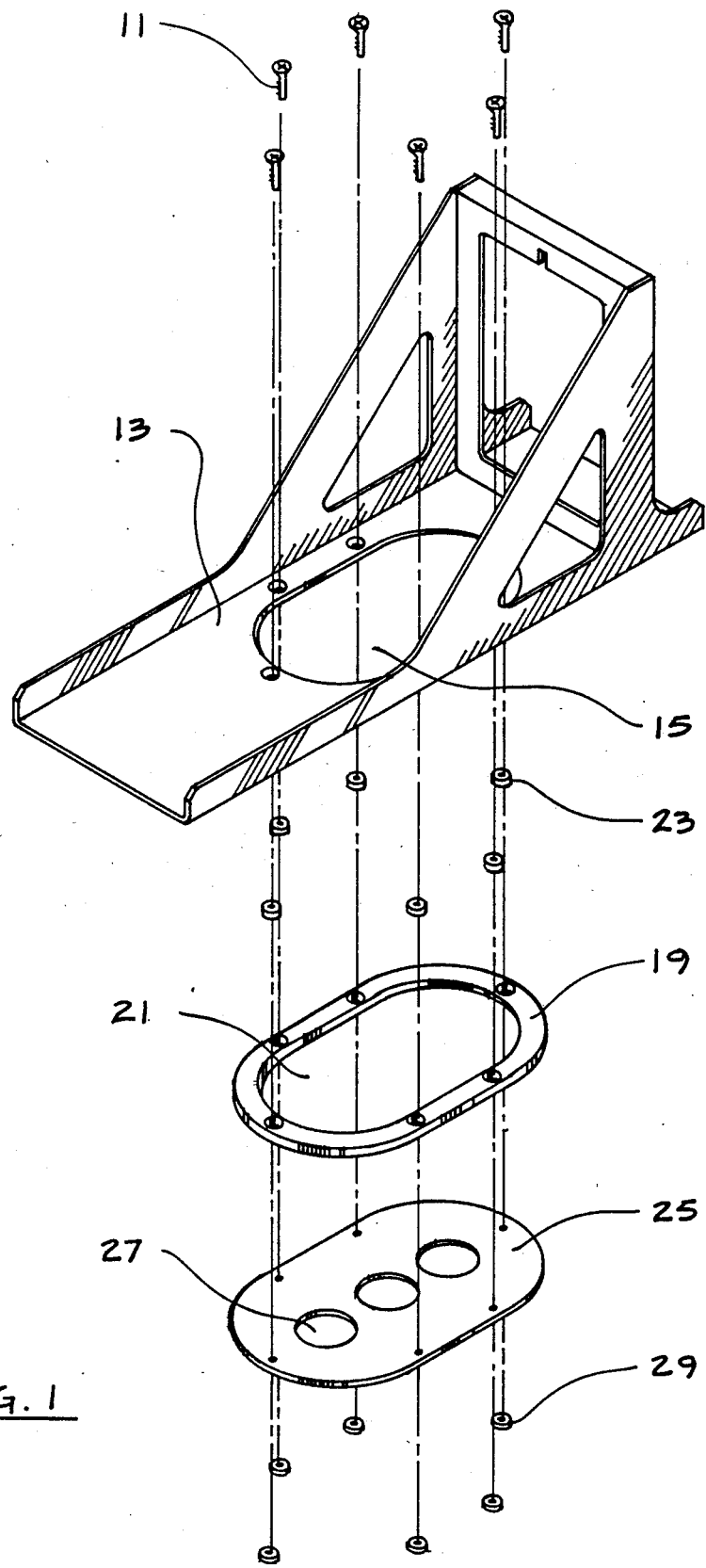
FIG. 1 is an exploded view.

Drawing Reference Numerals 11 flat head screws
13 tray
15 airflow orifice for 13
17 equipment mounting surface
19 gasket
21 airfow orifice for 19
23 compression stops
25 metering plate
27 metering ports
29 nuts
31 electronic unit (reference)

DESCRIPTION OF INVENTION

Figure 4:
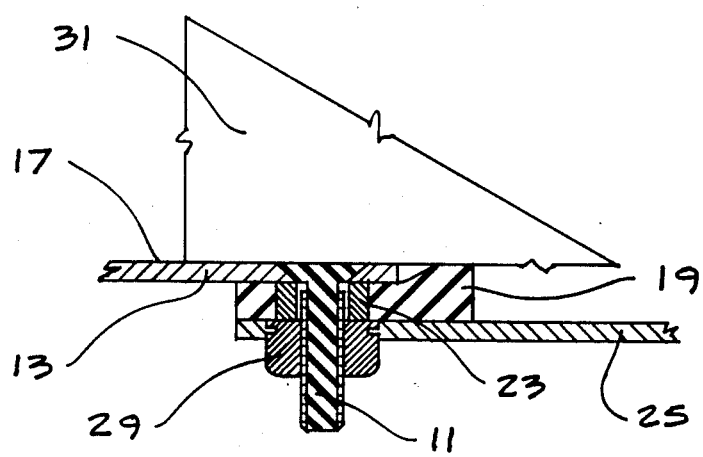
FIG. 4 is an enlarged sectional view of the gasket forming a seal between the tray, the metering plate, and the installed electronic unit (reference).

FIG. 1 shows an exploded assembly view of a cooling airflow coupling apparatus according to the invention. A plurality of flat head screws 11 are used to align and secure the gasket 19, the compression stops 23, and the metering plate 25, to the tray 13. The tray 13 has an entirely flat bottom surface and includes an airflow orifice 15 generally in the shape of an oval. A plurality of countesunk holes to accommodate the flat head screws 11, enable the equipment mounting surface 17, as shown in FIG. 4, to be smooth and free of protrusions. The tray 13 is constructed using matrial in sheet form of high strength and low weight. An important advantage of the tray 13 is that it can accommodate the gasket 19 and the metering plate 25 without the need for a recessed area on the bottom surface. Only a simple cutout, the airflow orifice 15, and the countersunk holes for the flat head screws 11 are required. This feature makes it possible to manufacture avionic trays at a significantly lower cost.

The gasket 19 is of a one-piece, jointless construction, die cut from a compressable material in sheet form. Another important advantage of the invention is the elimination of all joints, bonded or otherwise from the gasket 19 construction, thus greatly enhancing air seal reliability.

An airflow orifice 21 located in the center of the gasket 19 is of an oval shape similar to, although smaller than, the airflow orifice 15 for the tray 13. This differential in size creates an overlap, best seen in FIG. 2. In addition, the gasket 19 contains a plurality of clearance holes to accommodate the flat head screws 11 and the compression stops 23.

Figure 3:
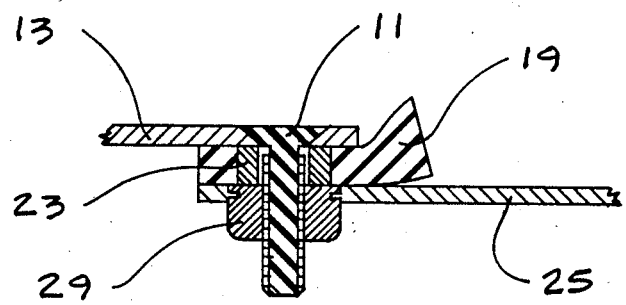
FIG. 3 is an enlarged sectional view of the gasket in a compressed condition, the metering plate, and the tray.

The cylindrically shaped compression stops 23, best seen in FIG. 3, provide a circular surface area to engage the tray 13 on the top surface, and the metering plate 25, on the bottom surface. The height of the compression stops 23 define the maximum compression of the gasket 19.

The metering plate 25 contains a plurality of metering ports 27 to control the airflow delivered to the electronic unit 31. The metering plate 25 is constructed using flat, rigid material, with the outer peripheral configuration identical to the outer peripheral configuration of the gasket 19. The metering plate 25 can be readily detached from the tray 13 and the gasket 19 thereby allowing a metering plate 25 with a different arrangement of metering ports 27 to be installed.

The nuts 29 engage the flat head screws 11 to align and secure the entire assembly. The nuts 29 are permanently attached to the metering plate 25 to provide an even greater ease of assembly.

OPERATION OF INVENTION

The cooling airflow coupling apparatus of FIG. 1 provides an airtight seal between the aircraft cooling system and the electronic unit 31. It also provides an interchangeable means to control the volume and location of airflow to the electronic unit 31.

Figure 2:
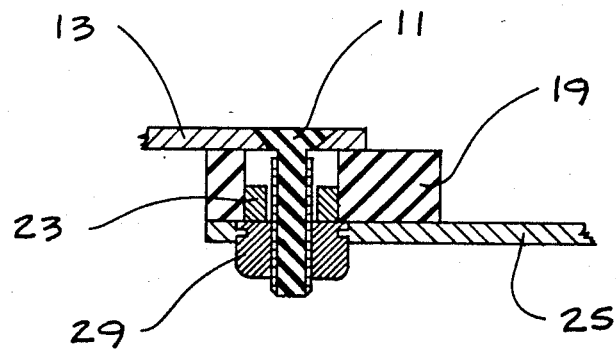
FIG. 2 is an enlarged section view of the gasket in an uncompressed condition, the metering plate, and the tray.

To prepare the avionic tray for service, the gasket 19 is placed between the bottom surface of the tray 13 and the upper surface of the metering plate 25. The metering plate 25 is selected to provide the desired arrangement and sizing of metering ports 27. One compression stop 23 is inserted in each of the mounting holes of the gasket 19. The flat head screws 11 are inserted into countersunk holes located on the equipment mounting surface 17 of the tray 13 and through clearance holes in the compression stops 23, the gasket 19, and the metering plate 25 respectively. Nuts 29 attached to the metering plate 25 engage the flat head screws 11 to align and secure the aforementioned components. At this stage the gasket 19 is in an uncompressed condition as shown in FIG. 2.

The gasket 19 is compressed between the tray 13 and the metering plate 25 by tightening the flat head screws 11. The flat head screws 11 are tightened until the tray 13 and the metering plate 25 seat against the compression stops 23, as shown in FIG. 3. The compression stops 23 also protect the gasket 19 from any abrasive action of the flat head screw 11 threads. At this stage the gasket 19 is fully compressed and protrudes through the airflow orifice 15 and above the equipment mounting surface 17 of the tray 13. The avionic tray with the cooling airflow coupling apparatus is at this point ready for service.

The portion of the gasket 19 that protrudes above the equipment surface 17 engages the electronic unit 31 when mounted on the tray 13, creating an airtight seal between the electronic unit 31, the tray 13, and the metering plate 25, as shown in FIG. 4.

While the above description contains many specificities, these should not be construed as limitations on the scope of the invention, but rather as an exemplification of one preferred embodiment thereof. Many other variations are possible. For example the airflow orifice 15 may be of a different size and shape, or located on a different surface of the tray 13. Other types of fasteners, or guide pins, such as rivets, or self clinching, flush mounted threaded studs may be used as an alternative to the flat head screws 11. The compression stops 23 may be permanently attached to the gasket 19. Another possible variation within the scope of this invention is that of its application. Shipboard and ground-based platforms utilizing similar mounting and cooling interfaces can also benefit from the improvements and advantages this invention provides.

I claim:

1. A cooling airflow coupling apparatus for avionic trays the combination which comprises:
    a one piece, jointless gasket;
    a tray having an entirely flat bottom surface with an airflow orifice therein;
    a detachable metering plate, said metering plate containing a plurality of metering ports;
    means aligning and securing said one piece, jointless gasket to said tray and said metering plate;
    means compressing said one piece, jointless gasket between said tray and said metering plate in such a manner that said one piece, jointless gasket protrudes through the airflow orifice of said tray, said protruding portion of said gasket provides an airtight seal between an electronic unit and said tray when said electronic unit is mounted on said tray;
    whereby said apparatus provides a highly reliable readily interchangeable, and cost effective cooling airflow coupling for avionic trays;
    further including a compression stop means to limit gasket compression.

2. The cooling airflow coupling apparatus of claim 1 wherein said one piece, jointless gasket is made from cellular elastomeric sheet material of uniform thickness.

3. The cooling airflow coupling apparatus of claim 2 wherein said one piece, jointless gasket is die cut from said cellular elastomeric sheet material of uniform thickness.

4. The cooling airflow coupling apparatus of claim 1 wherein said metering plate includes a plurality of self clinching, locking nuts.

5. The cooling airflow coupling apparatus of claim 1 wherein flat head screws are utilized as an element of the means aligning, securing, and compressing said one piece, jointless gasket between said tray and said metering plate.

6. The cooling airflow coupling apparatus of claim 1 wherein said compression stop is cylindrical in shape, and protects said one piece, jointless gasket from any abrasive action which may occur.

* * * * *